VARIABLE CAPACITANCE DIODE PACKAGES
Filed Sept. 11, 1964 2 Sheets-Sheet 1
FIG. 1
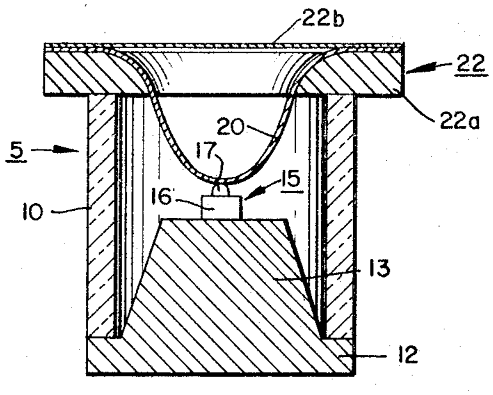
PRIOR ART
FIG. 2
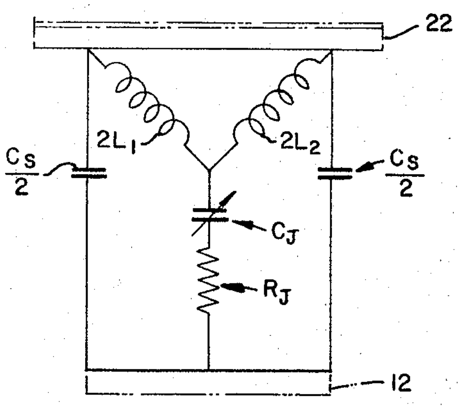
PRIOR ART
FIG. 3
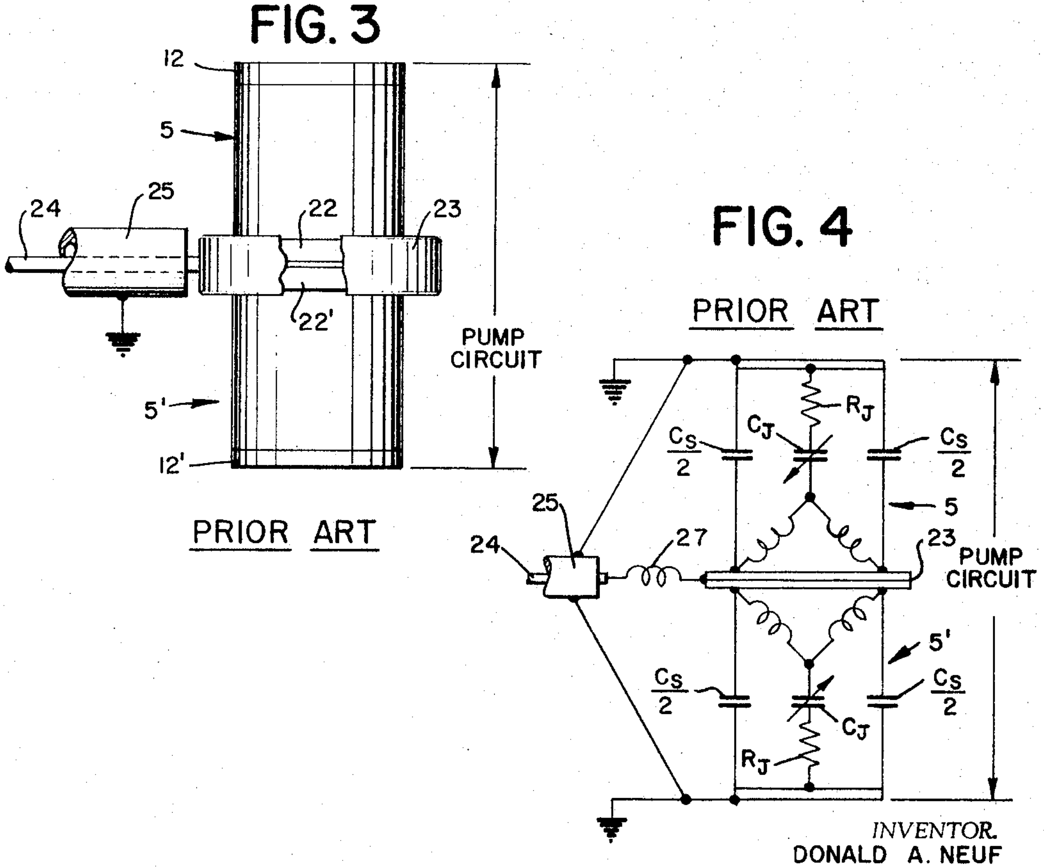
FIG. 3, FIG. 4
INVENTOR.
DONALD A. NEUF
BY Darby & Darby
ATTORNEYS INVENTOR.
DONALD A. NEUF
BY Darby & Darby
ATTORNEYS United States Patent Office 3,320,497
Patented May 16, 1967

3,320,497

VARIABLE CAPACITANCE DIODE PACKAGES

Donald Neuf, Wantagh, N.Y., assignor, by mesne assignments, to Control Data Corporation, South Minneapolis, Minn., a corporation of Minnesota Filed Sept. 11, 1964, Ser. No. 395,745
10 Claims. (Cl. 317—234)

This invention relates to variable capacitance diodes and more particularly to improved constructional techniques for diodes of this general type.

Variable capacitance diodes, commonly called varactors or varactor diodes in the art, are semiconductor devices which are used in many high frequency applications, particularly in the microwave range. Varactor diodes are useful due to their property of producing a variable capacitance at a junction of two semiconductor materials of opposite conductivity in response to an applied voltage across the junction.

Varactors have found one field of application in parametric amplifiers. As is known, parametric amplifiers are devices having low noise properties and large gain-bandwidth products. When used in a parametric amplifier a varactor is supplied with two signals. The first is the input signal to be amplified and the second is a so-called pump signal, whose frequency is higher than the input signal frequency. The difference in frequency between the two applied signals is called the idler frequency.

In parametric amplifiers it has been found that the simplest and most efficient type of idler circuit to be employed is one which makes use of the inherent self-resonant frequency of the varactor diode package used. The term diode package includes the actual diode semiconductor material, the diode outer housing, and the connecting leads and mounting structure for holding and electrically connecting the semiconductor material to the housing and the package into a circuit. When the inherent self-resonant frequency of the diode package is used, maximum gain-bandwidth product for the parametric amplifier is achieved because no added tuning elements are needed to produce a resonant circuit for the varactor at the desired idler frequency.

In general, the inherent self-resonant frequency of a varactor diode is determined by its inductance, which is in large part produced by the lead connection from one or both ends of the diode semiconductor material to the metallic end caps which are used to connect the diode into a circuit. Also influencing the self-resonance of the package is the junction capacity between the two semiconductor materials of opposite conductivity. It is this junction capacity which is varied in response to the input and pump signals to produce the amplification.

With the communications are resorting to the use of higher and higher frequencies it becomes increasingly more desirable to provide varactor diodes whose self-resonant frequencies are also higher. This permits the higher frequency varactor diodes to be used in the more efficient type of idler circuits which require no external resonant circuits.

In most cases it is extremely difficult to raise the self-resonant frequency of a varactor diode package without adding an excessive amount of stray capacity. This presents another problem since stray capacity across the varactor diode package is especially undesirable when an attempt is made to obtain large gain-bandwidth products or widely tunable amplifiers. In particular, the ratio of the junction capacity to stray capacitor is desirably made high to try to obtain the least amount of degradation of the applied potential versus variable junction capacitance characteristic of the diode.

The present invention is directed to improved construction techniques for varactor diode packages. Particularly, the invention is directed to a double varactor diode package construction in which a high self-resonant frequency is achieved by reducing the diode self-inductance by eliminating all but a small section of inner connecting contact material between the two diode halves by an off-setting technique. By varying the off-set distance between the two diodes, the self-resonant frequency of the package is controllable. The stray capacity of the diode package of the present invention is also minimized by eliminating the commonly used connection between the metal end caps of two diode halves which are to be connected in series. Instead, a small pin is used to make contact to the midpoint of both sections of the diode, which are internally connected in series in the package.

It is therefore an object of the present invention to provide improved construction techniques for varactor diode packages.

A further object is to provide a varactor diode package having two diodes whose self-resonant frequency is increased by the reduction of the self-inductance and stray capacity of the package.

Another object is to provide a varactor diode package in which two diode sections are connected to a single input signal lead by an off-setting technique which minimizes the self-inductance of the diode package and in which the self-inductance can be selected as desired.

Other objects and advantages of the present invention will become more apparent upon reference to the following specification and annexed drawings in which:

FIGURE 1 is an elevational view in section of a prior art varactor diode package;

FIGURE 2 is a partially schematic and partially mechanical representation of the electrical lumped constant parameters of the diode package of FIGURE 1;

FIGURE 3 is a plan elevation view of two of the prior art diodes of FIGURE 1 connected in series end to end;

FIGURE 4 is a schematic electrical and mechanical representation of the diode package of FIGURE 3 connected in a balanced parametric amplifier circuit;

Figure 5:
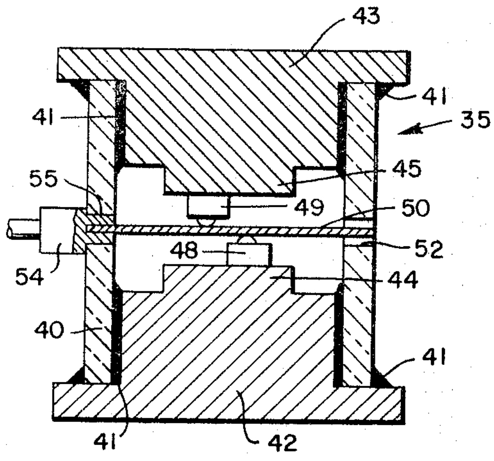
FIGURE 5 is a sectional elevational view of a diode package made in accordance with the present invention.

In FIGURE 1 a conventional prior art varactor diode package 5 is formed by a housing 10 of a suitable dielectric material such as a ceramic. One end of the housing 10 is sealed by a metallic end cap 12 having an upstanding base portion 13. A semiconductor varactor diode 15 is mounted on the upper surface of the base. The materials for the varactor diode 15 and the manner of mounting it on the base are conventional in the art and in themselves form no part of the present invention. Any suitable vacator diode may be utilized.

As illustrated, the diode 15 is of the mesa type and has a piece of semiconductor material (P or N) 16 of one conductivity. One face of semiconductor piece 16 is electrically connected to the upper portion of the base 13 by any suitable process, such as alloying or diffusion. The mesa raised portion 17 of the diode is of a material of the other conductivity (N or P) which forms a P-N junction with the other face of piece 16 made by any suitable process such as by vapor-diffusion. If desired, an epitaxial layer may be located between the P-N junction of the two materials 16 and 17 of opposite conductivity.

An electrical connection is made between the upper face of the mesa piece 17 and a contacting ribbon 20 which is generally U-shaped. The ribbon 20 has its ends connected to diametrically opposite sides of a second end cap 22. End cap 22 is formed by an annular metallic ring 22*a* which is fastened to housing 10 and a generally circular metallic plate 22*b* which seals off the end of the package opposite end cap 12. As is known, application of a reverse bias voltage across the two metallic end caps 12 and 22 causes the junction capacity of the diode 15 to vary.

The electrical representation of the diode of FIGURE 1 is shown in FIGURE 2. As should be evident, the lead or ribbon 20 has an inherent self-inductance at high frequency due to its physical dimensions. This self-inductance is represented by the quantity $L_1$. The stray capacitance of the diode package is designated $C_S$. The variable capacitance of the junction is designated $C_J$ and the resistance of the junction is designated $R_J$.

As shown in FIGURE 2, the resistance $R_J$ of the junction is connected in series between the end cap 12 and the variable capacitance $C_J$ of the junction. The self-inductance, produced primarily by the lead 20, is divided into two parts each connected between the junction and end cap 22 and each designated $2L_1$. As should be clear, addition of two parallel connected self-inductances of a quantity $2L_1$ produces an overall self-inductance of $L_1$. The stray inductances shown between the two end caps 12 and 22 are designated as $C_S/2$ and these are added in parallel to give the overall stray capacity $C_S$.

The self-resonant frequency of the diode package of FIGURE 1 is given by the following:

$$f_r=\frac{1}{2\pi\sqrt{L_1C_J}} \tag{1}$$

The non-linearity degradation of the non-linear applied potential vs. junction capacity characteristic is given as:

$$\text{Non-linearity degradation}=\frac{C_J}{C_S} \tag{2}$$

FIGURE 3 shows two similar prior art diodes 5 and 5' of FIGURE 1 serially connected end to end for application in a balanced parametric amplifier circuit. The two diodes have their metallic end caps 22 and 22' electrically connected together by any suitable means such as a metallic clamp ring 23. It should be understood that this type of connection by clamp 23 or any similar means introduces a considerable amount of stray capacity.

In FIGURE 3 the pump signal from a suitable source (not shown) is applied across the end caps 12 and 12'. The input signal is applied from a suitable source (not shown) by a signal line 24 through a matching network 25 to the junction of the two end caps 22 and 22' by connection to clamp 23.

The electrical lumped parameter equivalent circuit of the arrangement of FIGURE 3 is shown in FIGURE 4. The same designations are used here as are used in FIGURE 2. The input signal on line 24 is supplied through matching network 25 which is used to match the impedance of the parametric amplifier circuit to peripheral equipment such as a circulator (not shown) which has a nominally higher characteristic impedance than the amplifier circuit. This matching section is needed to improve and to obtain the necessary gain and bandwidth response from the circuit. The input signal also passes through an inductance 27 which tunes out the diode junction capacity at the signal frequency.

As should be clear from an examination of FIGURE 4, the input signal circuit effectively has the stray capacity of both diodes 5 and 5' in parallel with it. Except for the addition of stray capacity by clamp 23 the overall ratio of the junction capacity to the stray capacity is unchanged owing to the effective addition of the junction capacities of the two diode packages. It should also be noted that each diode package still has its own inherent self-inductance so that the self-resonant frequency of an individual diode is not lowered in any respect in the balanced circuit.

FIGURE 5 shows an improved package having two varactor diodes constructed in accordance with the present invention. As shown, the package includes an outer housing 40 of a suitable material, such as a ceramic, having an end cap 42 and 43 sealed at each end thereof. This is accomplished by the metal to ceramic sealing material 41. The end caps 42 and 43 have a respective raised base portion 44 and 45 with a substantially flat top which serves as a base for a respective mesa type varactor diode 48 and 49. As before, the diodes 48 and 49 may be of any desired construction and material.

The mesa portion of each of the diodes 48 and 49 is electrically connected to a piece of ribbon type connector material 50 suspended across the interior of housing 40. The two mesa contacts are off-set relative to one another. One end of the connector material 50 is suitably held within a sealed hole 52 in one side of housing and the other end is electrically connected to a connector 54 sealed in a hole 55 in housing 40 at a point diametrically opposite of the hole 52.

From an examination of the diode package of FIGURE 5 it should be clear that the effective self-inductance of the package is reduced since the generally U-shaped ribbon type lead of FIGURE 1 is not utilized. Instead, a single straight ribbon type lead 50 is used for two diodes with the major portion of the self-inductance occurring on the ribbon 50 between the mesa contacts of the two diodes.

It should be undestood that the self-inductance of the diode package of FIGURE 5 can be adjusted by off-setting the two diodes 48 and 49 with respect to the connecting member 50. As the distance between the two mesa contacts is increased, the self-inductance of the package also increases resulting in a decrease in the self-resonant frequency of the package. Conversely, a decrease in the diode spacing decreases the self-inductance and raises the self-resonant frequency.

Since the common connecting ring 23 between two diode packages, such as in FIGURE 3, is eliminated and replaced with a smaller pin-type connector 54 which connects to the ribbon 50 connecting together ends of the same conductivity of both diodes, the stray capacitance of the package across the input signal circuit is also decreased. This, of course, increases the ratio $C_J/C_S$.

Figure 6:
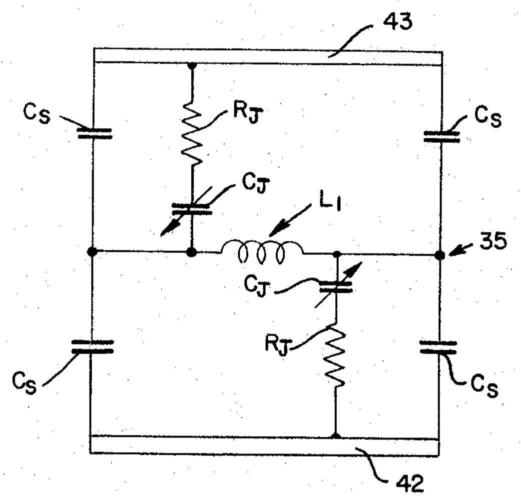
FIGURE 6 is a schematic electrical and mechanical representation of the diode package of FIGURE 5.

FIGURE 6 shows the electrical circuit equivalent for the diode package of FIGURE 5. The same symbols are used as in FIGURES 2 and 4 where applicable. It should be noted that the self-inductance $L_1$ is reduced to the inductance of the single piece of connecting ribbon lead 50 as compared to the inductance of the four pieces of connecting material of FIGURE 4. Further, the stray capacitance $C_S$ is reduced since the diodes 48 and 49 are connected internally of the housing and the clamp 23 between end caps 22 and 22' is eliminated. Also, there will be a considerable simplification in the mounting of the double diode package of FIGURE 5 in an external circuit as compared to the package of FIGURE 3.

Figure 7:
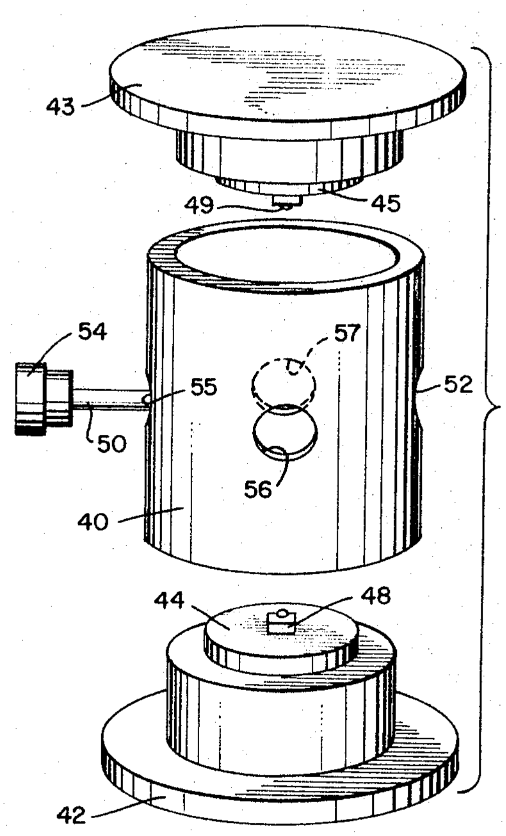
FIGURE 7 is an exploded perspective view of the diode package of FIGURE 5.

By referring to FIGURE 7, the method of constructing the diode package of FIGURE 5 may be more fully explained, as follows. First, the ribbon 50, which is preferably of gold or gold plated, is connected to connector 54 in any suitable manner, such as by soldering or welding. The ribbon 50 is then stretched across the holes 52 and 55, which are metalized around the edges, and then soldered into place. The solder seals the holes. After this is done the end caps 42 and 43 are positioned at opposite metalized ends of the housing 40. The diodes 48 and 49 are already attached to the base members 44 and 45, and proper spacing or off-set is maintained between the mesa contacts of both diodes to achieve the desired self-inductance. The end caps 42 and 43 are then soldered to metalized ends of the ceramic body as at 41 of FIGURE 5.

During this time, two extra metalized holes 56 and 57 in opposite sides of the housing 40 are used to view the positioning of the mesa contacts of the two diodes with respect to ribbon 50. The connection between the mesa contacts of the diodes and the ribbon 50 may be achieved in any of a number of ways. If a bonded contact is desired, for example, a laser welder may be employed by focusing the beam through the observation holes 56 and 57 in the body. An alternative way is to tin plate the ribbon 50 prior to assembly and then after the diodes are in place apply a small voltage across both ends of the conductor 50 to melt the tin in the vicinity of the mesa contacts and make connection thereto. The diode package is then evacuated and sealed by soldering the metalized observation windows 56 and 57.

In constructing varactor diode packages it is desirable to have a ratio of at least 10 to 1 between the diode's variable junction capacity and the fixed stray capacity of the diode package used. In the present state of the art, most varactor diode packages presently available with nominal junction capacity of less than 1 picofarad have junction to stray capacity ratios which seldom exceed 4 to 1. When the junction capacities of the varactor diode are in the order to .4 to .5 picofarads, the junction to stray capacity is even less, typically only 1 to 2 times. By using the construction and packaging techniques of the present invention, the junction to stray package capacity ratio can be approximately doubled over that presently obtainable in a series connection diode configuration.

Also, the present invention provides a significant reduction in the self-inductance between two serially connected diodes by the use of the off-set technique previously described. This, of course, raises the self-resonant frequency of the varactor diode package.

While a preferred embodiment of the invention has been described above, it will be understood that this is illustrative only, and the invention is limited solely by the appended claims.

What is claimed is:

1. A diode package comprising:
an outer housing of insulating material,
a contact member held within said housing by the walls thereof,
a cap at each end of said housing having a base portion located within the housing,
and a diode on each said base portion, each said diode being electrically connected to said contact member and offset thereon with respect to each other.

2. A diode package comprising:
an outer housing of insulating material, a generally flat ribbon contact member in the interior of said housing,
a cap sealing each end of said housing,
a base portion electrically connected to each said cap,
and a diode having one terminal thereof electrically connected to each said base portion and the other terminal thereof electrically connected to said ribbon contact member at offset points on opposite sides thereof, the spacing of the diodes adjusting the self-inductance of the diode package.

3. A diode package comprising:
an outer housing of insulating material, a generally flat ribbon contact member in the interior of said housing,
a cap sealing each end of said housing,
a base portion electrically connected to each said cap,
a diode having one terminal thereof electrically connected to each said base portion and the other terminal thereof electrically connected to said ribbon contact member at offset points on opposite sides thereof, the spacing of the diodes adjusting the self-inductance of the diode package,
and an electrical connector member connected to said ribbon contact member and having a portion thereof extending outside of said housing to provide electrical connection to the said other terminals of said body.

4. A diode package as in claim 3 and further comprising the wall of said housing being formed with at least one opening to permit observation of the diodes with respect to the ribbon contact member during assembly of the package.

5. A double diode package comprising:
an outer housing of insulating material,
a contact member across the interior of the housing held by means sealing openings in the walls thereof, one of said sealing means including an electrical connector connected to said contact member,
an electrically conductive cap at each end of said housing, each cap having a base portion thereon extending toward said contact member,
and a semiconductor diode having a first portion thereof electrically connected to the base portion of a respective cap, a second portion of each said diode being electrically connected to said contact member at offset points thereon.

6. A double diode package as set forth in claim 5 wherein said diodes are of variable capacitance and said package comprises means for varying the offset of the portions of the diodes connected to said contact member thereby adjusting a self-inductance component and the self-resonant frequency of the package.

7. A double diode varactor package comprising:
a housing of insulating material,
a ribbon contact member across the interior of the housing held by means sealing openings in the walls thereof, one of said sealing means including an electrical connector which is connected to said ribbon and having a portion thereof extending outside of said housing,
an electrically conductive cap sealed at each end of said housing, each cap having a base portion thereon extending toward said ribbon on opposite sides thereof,
and a mesa type variable capacitance diode for the base portion of each cap having one terminal thereof electrically connected to said base portion, the mesa of each said diode being electrically connected to said ribbon contact member offset at spaced points on opposite sides thereof, the spacing of the said point points varying the self-inductance of the diode package.

8. A double diode varactor package as set forth in claim 7 and further comprising the wall of said housing being formed with at least one opening therein to permit observation of the spacing of the diodes with respect to the ribbon contact member during assembly of the package, and means for sealing the observation openings.

9. A double diode package as set forth in claim 7 wherein said ribbon contact member is held across the interior of the housing and is generally straight to lower the self-inductance of the package.

10. A diode package comprising a housing, an electrically conductive contact member mounted within said housing and insulated therefrom, a pair of diodes within said housing, means for electrically connecting one electrode of each said diodes to said contact member offset with respect to each other for producing inductance between the two diodes, and electrically conductive terminal means connected to the other electrode of each of said diodes.

No references cited.

JAMES D. KALLAM, *Primary Examiner.*